(12) United States Patent
Leobandung et al.

(10) Patent No.: US 11,574,694 B2
(45) Date of Patent: Feb. 7, 2023

(54) KERNEL SETS NORMALIZATION WITH CAPACITOR CHARGE SHARING

(71) Applicant: INTERNATIONAL BUSINESS MACHINES CORPORATION, Armonk, NY (US)

(72) Inventors: Effendi Leobandung, Stormville, NY (US); Tayfun Gokmen, Briarcliff Manor, NY (US); Xiao Sun, Yorktown Heights, NY (US); Yulong Li, Hartsdale, NY (US); Malte Rasch, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1155 days.

(21) Appl. No.: 16/157,848

(22) Filed: Oct. 11, 2018

(65) Prior Publication Data
US 2020/0118638 A1 Apr. 16, 2020

(51) Int. Cl.
*G11C 27/00* (2006.01)
*G06N 3/04* (2006.01)
*G06N 3/063* (2023.01)

(52) U.S. Cl.
CPC ............. *G11C 27/00* (2013.01); *G06N 3/04* (2013.01); *G06N 3/0635* (2013.01)

(58) Field of Classification Search
CPC ......... G11C 27/00; G06N 3/04; G06N 3/0635
See application file for complete search history.

(56) References Cited

U.S. PATENT DOCUMENTS

| | | | |
|---|---|---|---|
| 4,926,180 A | 5/1990 | Anastassiou | |
| 4,961,005 A | 10/1990 | Salam | |
| 5,039,870 A | 8/1991 | Engeler | |
| 5,140,670 A | 8/1992 | Chua et al. | |
| 9,430,735 B1 | 8/2016 | Vali et al. | |
| 9,514,818 B1 * | 12/2016 | Roizin | H01L 29/4916 |
| 9,659,249 B1 | 5/2017 | Copel | |
| 9,715,655 B2 | 7/2017 | Wu et al. | |
| 9,791,638 B2 | 10/2017 | Schie | |
| 2004/0017236 A1 * | 1/2004 | Shi | H03K 3/033 327/172 |
| 2017/0169327 A1 | 6/2017 | Nestler et al. | |
| 2019/0080231 A1 * | 3/2019 | Nestler | G06N 3/0481 |

* cited by examiner

*Primary Examiner* — Stephen G Sherman
(74) *Attorney, Agent, or Firm* — Tutunjian & Bitetto, P.C.; Randy Emilio Tejeda

(57) ABSTRACT

A method for multiple copies of a set of multi-kernel set operations in a hardware accelerated neural network includes a word line for receiving a pixel value of an input image. A bit line communicates a modified pixel value. An analog memory cell including a first capacitor stores a first kernel weight of a first kernel in one of a plurality of kernel sets such that the pixel value is operated on by the first kernel weight to produce the modified pixel value. A charge connection connects the first capacitor to at least a second capacitor storing a second kernel weight of a related kernel of a second one of the plurality of kernel sets such that charge is shared between the first capacitor and at least the second capacitor to normalize the first kernel weight and the second kernel weight.

18 Claims, 10 Drawing Sheets

KERNEL SETS NORMALIZATION WITH CAPACITOR CHARGE SHARING

BACKGROUND

Technical Field

The present invention generally relates to hardware accelerated matrix operations, and more particularly to kernel sets normalization with capacitor charge sharing.

Description of the Related Art

Accelerating matrix operations with hardware can improve execution of functions and programs utilizing matrix operations. However, for some operations, such as, e.g., neural networks including convolutional neural network (CNN), hardware acceleration can result in a large number of operations to forward pass all of the data, such as, e.g., image data. Indeed, an image processed by a CNN can result in a prohibitively large number of operations, and, thus, impractically long duration for processing of the image data.

SUMMARY

In accordance with an embodiment of the present invention, a device for multiple copies of a set of multi-kernel set operations in a hardware accelerated neural network is presented. The device includes a word line for receiving a pixel value of an input image. A bit line communicates a modified pixel value. An analog memory cell including a first capacitor stores a first kernel weight of a first kernel in one of a plurality of kernel sets such that the pixel value is operated on by the kernel weight to produce the modified pixel value. A charge connection connects the first capacitor to at least a second capacitor storing a second kernel weight of a related kernel of a second one of the plurality of kernel sets such that charge is shared between the first capacitor and at least the second capacitor to normalize the first kernel weight and the second kernel weight.

In accordance with another embodiment of the present invention, a device for multiple copies of a set of multi-kernel set operations in a hardware accelerated neural network is presented. The device includes a first cross-bar array for accelerating convolution of at least one first patch of an input image. The first cross-bar array includes a first plurality of word lines for receiving pixel values of an input image, a first plurality of bit lines for communicating modified pixel values, and a first plurality of analog memory cells, each analog memory cell including a capacitor for storing a corresponding kernel weight of a first kernel in one of a plurality of kernel sets such that each pixel value is operated on by the kernel weight to produce the modified pixel value. At least a second cross-bar array separate from the first cross-bar array accelerates convolution of at least one second patch of the input image. A charge connection connects the first capacitor to at least a second capacitor of at least the second cross-bar array, the second capacitor storing a second kernel weight of a related kernel of a second one of the plurality of kernel sets such that charge is shared between the first capacitor and at least the second capacitor to normalize the first kernel weight and the second kernel weight.

In accordance with another embodiment of the present invention, a method for multi-kernel set operations in a hardware accelerated neural network is presented. The method includes a pixel value of an input image that is received with a word line. A modified pixel value is produced from the pixel value with a first analog memory cell including a first capacitor for storing a first kernel weight of a first kernel in one of a plurality of kernel sets such that the pixel value is operated on by the kernel weight. The modified pixel value is communicated through a bit line. A charge is shared between the first capacitor and at least a second capacitor storing a second kernel weight of a related kernel of a second one of the plurality of kernel sets using a charge connection connecting the first capacitor to at least the second capacitor to normalize the first kernel weight and at least the second kernel weight.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
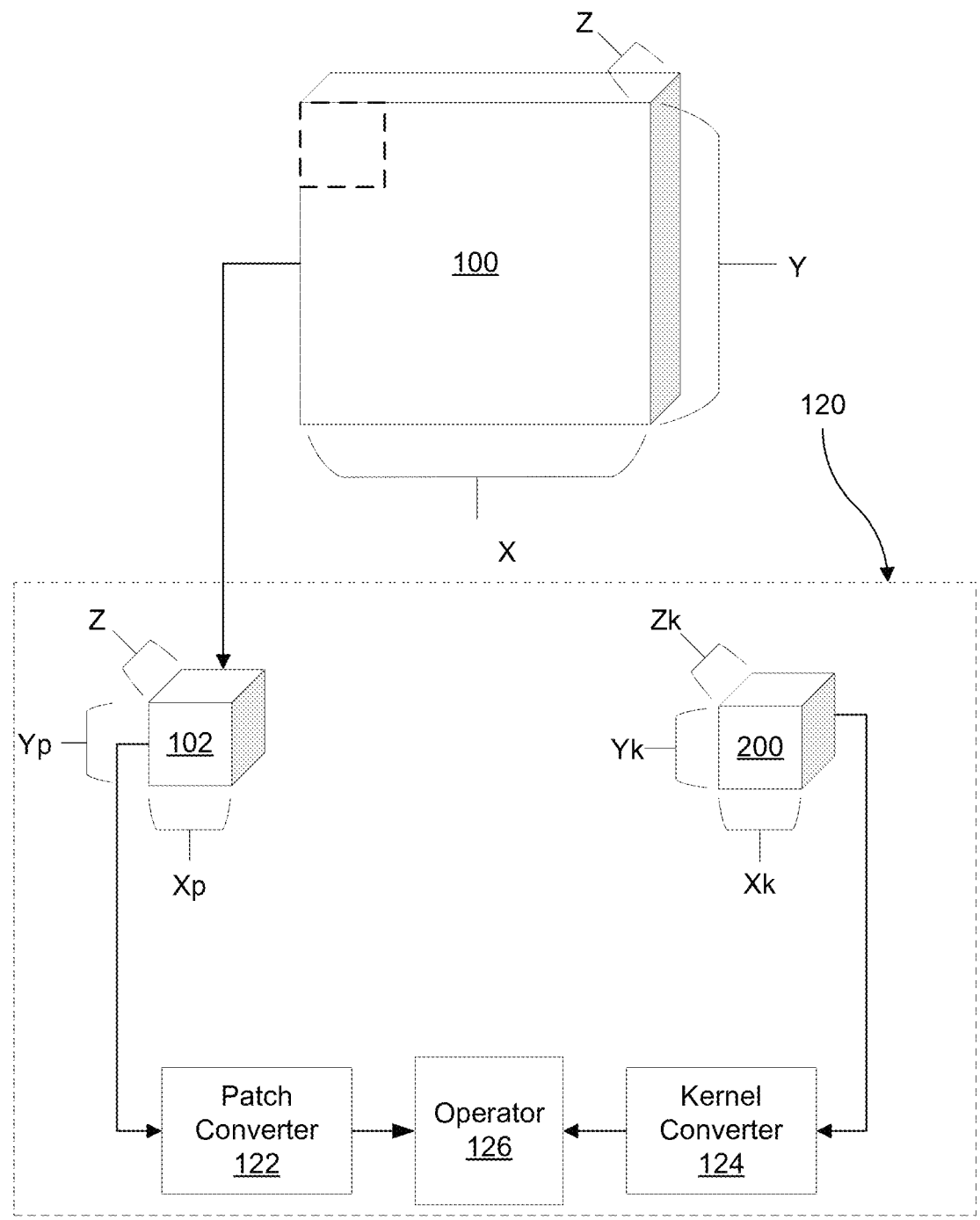
FIG. 1 is a representation showing an image with a selected patch operated on by a kernel, in accordance with an embodiment of the present invention.

Aspects of the present invention include a method and system for performing matrix operations using sets of kernels to decrease forward pass time, and thus reduce processing time. The sets of kernels can each be applied to, e.g., patches of an input image to provide matrix operations concurrently for, e.g., a convolutional neural network (CNN).

For instance, the input image can be divided into patches having a size corresponding to the kernels. The patches can be represented by pixel values in two dimensions with a third dimension for channels corresponding to each pixel. Each patch can be represented in row vector form. Each patch can then be concatenated together as rows of a matrix. Similarly, the kernels can be represented in column array form and concatenated as columns of a matrix. Thus, matrix operations, such as, e.g., matrix multiplication or convolutions, can be performed using two dimensional matrices.

However, the matrix of patches can include a subset of patches rather than all the patches. Thus, multiple matrices can be formed from multiple sets of patches. Similarly, corresponding kernel sets can be formed into matrices. Thus, a patch can be operated on by a corresponding set of kernels in parallel.

The matrix operations can be performed by a system employing capacitor unit cells, including, e.g., capacitors for analog memory. Each set of kernels can be implemented by a corresponding set of capacitor unit cells. For example, the capacitor unit cells can be arranged in a cross-bar array configuration where a column of capacitor unit cells can be formed corresponding to a kernel in a set of kernels. Each set of kernels can be implemented by a separate cross-bar array. As a result, patches corresponding to each set can be concurrently provided to capacitor unit cells by separate cross-bar arrays. Thus, the cross-bar arrays can process the input images in parallel, increasing the speed of forward pass operations, such as, e.g., matrix multiplication or convolutions.

To speed up the processing of the large number of patches, it is useful to have multiple copies of the set of kernels so that the patches can be processed in parallel. Periodically normalizing the multiple copies of the set of kernels can help decrease error and variability. Thus, the capacitor unit cells can include pass gates connecting a capacitor unit cell for a kernel to a capacitor unit cell for a corresponding kernel in another set. The pass gate can therefore perform normalization on the kernels.

Exemplary applications/uses to which the present invention can be applied include, but are not limited to: analog memory cells, neural networks and machine learning, among other applications using matrix operations.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a representation showing an image with a selected patch operated on by a kernel is depicted according to an embodiment of the present invention.

According to aspects of the present invention, an input image 100 can be processed. For example, the input image 100 can be provided to a convolutional layer 120 of, e.g., a convolutional neural network (CNN), to be processed with a kernel for image analysis, such as, e.g., object recognition, image filtering, or other image processing techniques employing convolution or matrix multiplication.

The input image 100 can include three dimensions of data. A first dimension can include a width X according to a number of pixels across a horizontal axis of the image. A second dimension can include a height Y according to a number of pixels across a vertical axis of the image. A third dimension can include a depth Z according to a number of channels per pixel such as, e.g., color channels, or other channels for defining an image.

To process the input image 100, the input image 100 can be operated on by a kernel 200 using the convolutional layer 120. To do so, patches 102 can be extracted from the input image 100 according to a stride, such as, e.g., a stride of one pixel, two pixels, or any number of pixels suitable for a kernel 200 of a given size, such as, e.g., a 3 by 3 kernel, 5 by 5 kernel, or any other kernel size. Each patch 102 can be extracted according to a size of the kernel 200 being used.

As such, a kernel 200 having a width Xk and height Yk results in patches of width Xp pixels of the input image 100 and height Yp pixels of the input image 100. Width Xk and width Xp have a same number of values, and height Yk and height Yp have a same number of values. As a result, the width Xk and height Yk of the kernel 200 and the width Xp and height Yp of the patch 102 form matrices of similar size. Moreover, the patch 102 has a depth Z equivalent to the depth Z of the input image 100. Accordingly, the kernel 200 also has a depth Zk that is similar to the depth Z to facilitate performing operations at each channel of the input image 100.

However, three-dimensional matrix operations can be difficult and computationally expensive to perform. Accordingly, aspects of the present invention can include a patch converter 122 to convert the three-dimensional patch 102 to, e.g., a two-dimensional matrix or a vector form. Similarly, a kernel converter 124 can be included that converts the three-dimensional kernel 200 to, e.g., a two-dimensional matrix or a vector form. Thus, an operator 126 can perform matrix operations between the kernel matrix and the patch matrix more quickly and efficiently. For example, the operator 126 can perform, e.g., matrix multiplication or convolution between the kernel matrix and the patch matrix to determine an updated value for a selected pixel of the patch 102. The selected pixel can be, e.g., the center pixel of a square patch 102, or any other determined position of the patch 102.

Figure 2:
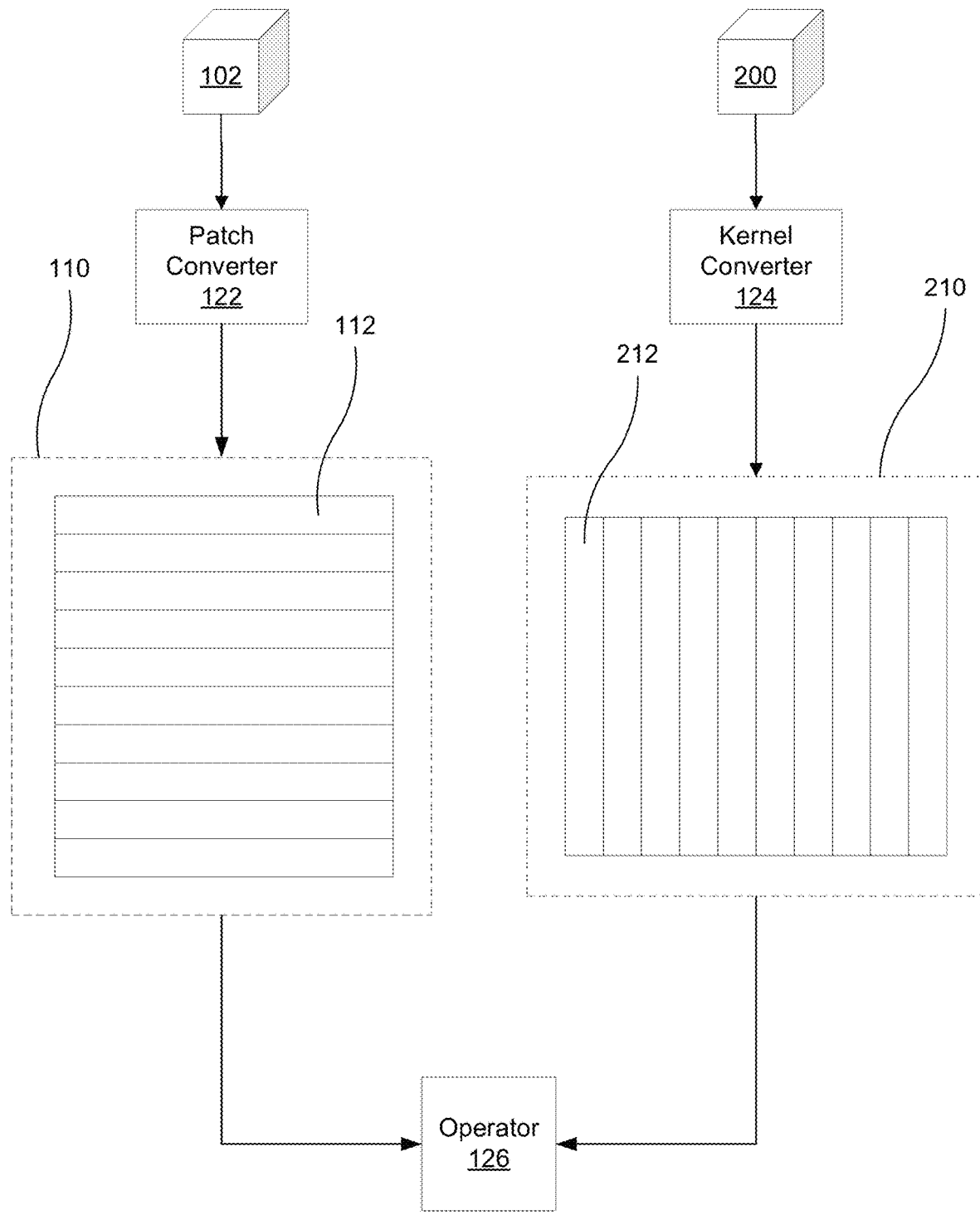
FIG. 2 is a diagram showing a matrix representation of an image patch set corresponding to an image and a kernel set, in accordance with an embodiment of the present invention.

Referring now to FIG. 2, a diagram of a matrix representation of an image patch set corresponding to an image and a kernel set is depicted according to an embodiment of the present invention.

According to aspects of the present invention, the patch converter 122 can convert a three-dimensional patch 102 to a vector 112. For example, the patch converter 122 can include, e.g., an im2col function, or other similar function for converting three-dimensional matrices into column or row vectors. For example, pixel values from the patch 102 can be reorganized into a vector by adding the values into the vector 112 by adding the top row of the first channel, then the second row, and continuing down until the bottom row of the first channel is reached, and then moving to the top of the second channel, etc. Each value can be added in a series along the indices of a row vector 112. Similarly, the values of the kernel 200 can be converted to a vector 212 with a similar left to right, then top to bottom, then front to back order of inputting values into the vector. Except, where the vector 112 is a row vector, vector 212 is a column vector.

An image matrix 110 can include a row vector 112 for each patch 102 of the input image 100 according to the stride used. As a result, the image matrix 110 forms a two-dimensional matrix representing the input image 100. Similarly, a column 212 can be added to a kernel matrix 210 according to the number of patches 102 of the patch matrix 110. Therefore, each patch vector 112 has a corresponding kernel vector 212. Each kernel vector 212 can be a representation of a single kernel 200. However, multiple kernels 200 can be used and added to the kernel matrix 210 as kernel vectors 212. Thus, matrix operations such as, e.g., matrix multiplication, including a dot product, or convolutions, can be easily performed by the operator 126. While representing an input image 100 as the image matrix 110 with a corresponding kernel matrix 210 utilizes a large amount of memory relative to a three-dimensional matrix, the two-dimensional image matrix 110 and kernel matrix 210 facilitate fast and efficient processing of the input image 100.

According to an aspect of the present embodiment, the kernel 200, and thus the kernel matrix 210, can include learned weights for, e.g., object recognition, semantic segmentation, or other application of a convolutional layer of a CNN. The weights can be learned as values of the kernel 200, or as a separate matrix that is then applied to the kernel matrix 210 and the image matrix 110 at the operator 126. Other configurations are also contemplated for incorporating trained weights.

Figure 3:
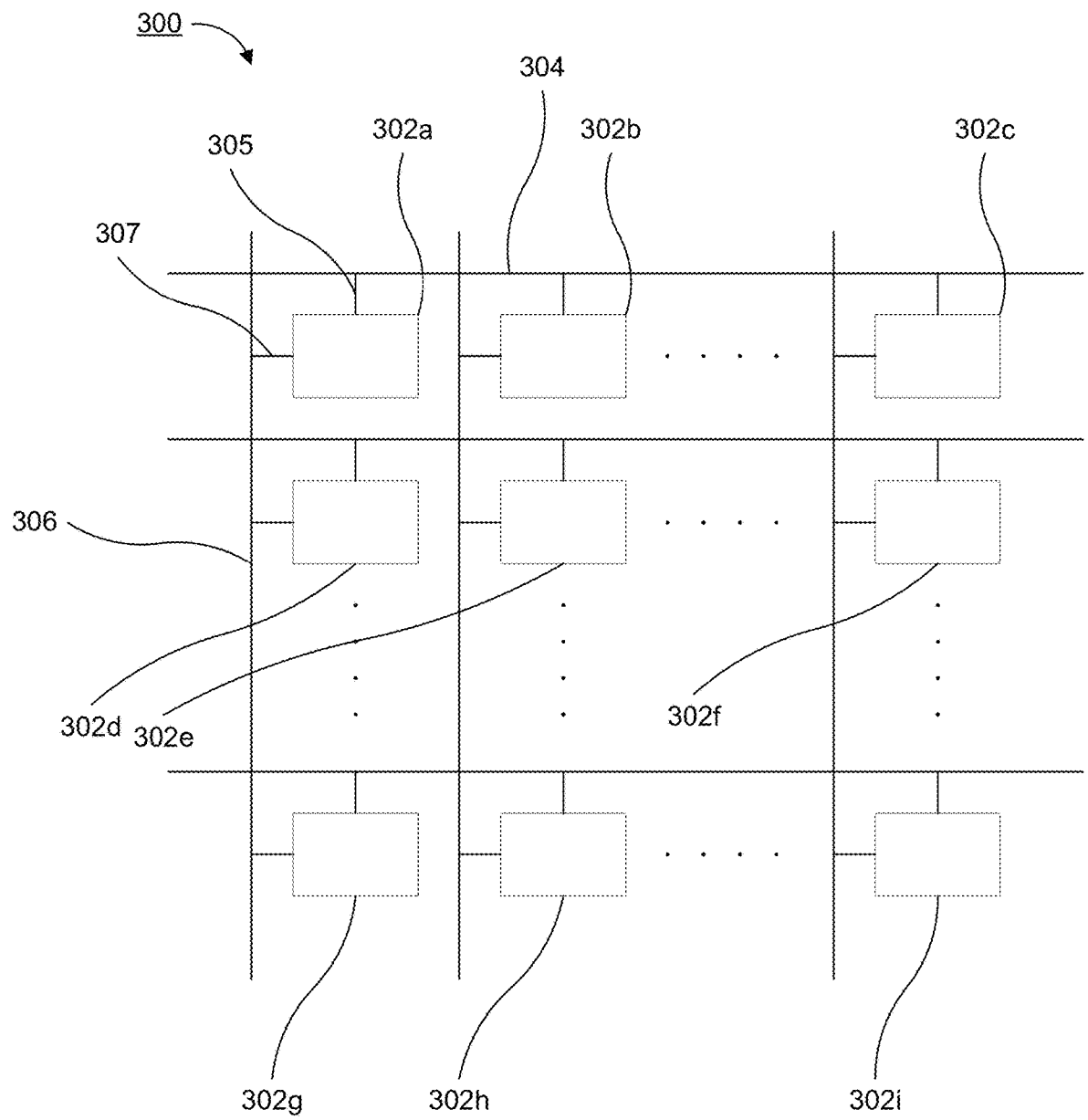
FIG. 3 is a diagram showing a network of capacitive analog memory circuits for performing matrix operations with a set of kernels, in accordance with an embodiment of the present invention.

Referring now to FIG. 3, a diagram of a network of capacitive analog memory circuits for performing matrix operations with a set of kernels is depicted according to an embodiment of the present invention.

According to aspects of the present invention, a kernel matrix can be implemented using an array 300 of analog memory cells or circuits 302a, 302b, 302c, 302d, 302e, 302f, 302g, 302h and 302i. As such, hardware can be used to accelerate matrix operations using kernels by storing a weight corresponding to a weight value of each entry of the kernel matrix in each of the analog memory cells 302a-i. For example, a first kernel vector of the kernel matrix can be implemented by setting the weights of analog memory cells 302a and 302d through 302g with the respective weight values of the first kernel vector. Therefore, a column of analog memory cells 302a and 302d to 302g can correspond to a kernel vector column of the kernel matrix. Similarly, analog memory cells 302b and 302e to 302h can be set to correspond to kernel values of a second kernel vector in the kernel matrix.

According to one possible embodiment, the analog memory cells 302a-i can store corresponding learned kernel weights to perform operations on image values during a forward pass. Thus, kernel values including learned weights can be used to perform matrix operations, such as, e.g., matrix multiplication or convolutions on the pixel values of an image. According to this configuration, a first image vector corresponding to an image patch can be provided to the array 300 via a word line 304. The signal representing the pixel values can be provided from the word lines 304 to each of the analog memory cells 302a-i of the corresponding kernel vector, e.g., analog memory cells 302a, 302d, and 302g of the first kernel vector, by word line connections 305.

Accordingly, a first pixel value is provided to a first analog memory cell 302a corresponding to the first kernel value of the first kernel vector. The first analog memory cell 302a performs a multiplication between the stored weight and the first pixel value. Similarly, a second pixel value is provided to a second analog memory cell 302d, and a third pixel value is provided to a third analog memory cell 302g. A storage component, such as, e.g., a capacitor or resistor, can modify the incoming pixel value from the word line 304 to multiply the incoming signal with a stored value corresponding to an associated kernel value. As a result, each of the first, second and third analog memory cells 302a, 302d and 302g produces an output signal corresponding to an output value of a pixel value multiplied by a kernel value.

The output values from each of the first, second and third analog memory cells 302a, 302d and 302g are output to a bit line 306 via bit line connections 307. By outputting all of the output values to the bit line 306, the output values are summed to generate an updated pixel value for a selected pixel of the image vector for an image patch. Analog memory cells 302b, 302e and 302h can form a second kernel vector. Thus, pixel values of an image patch input via word lines 304 can be similarly operated on by the second kernel vector and output via a bit line 306. Each column of analog memory cells can be implemented in a similar manner to form each kernel vector of a kernel matrix.

Figure 4:
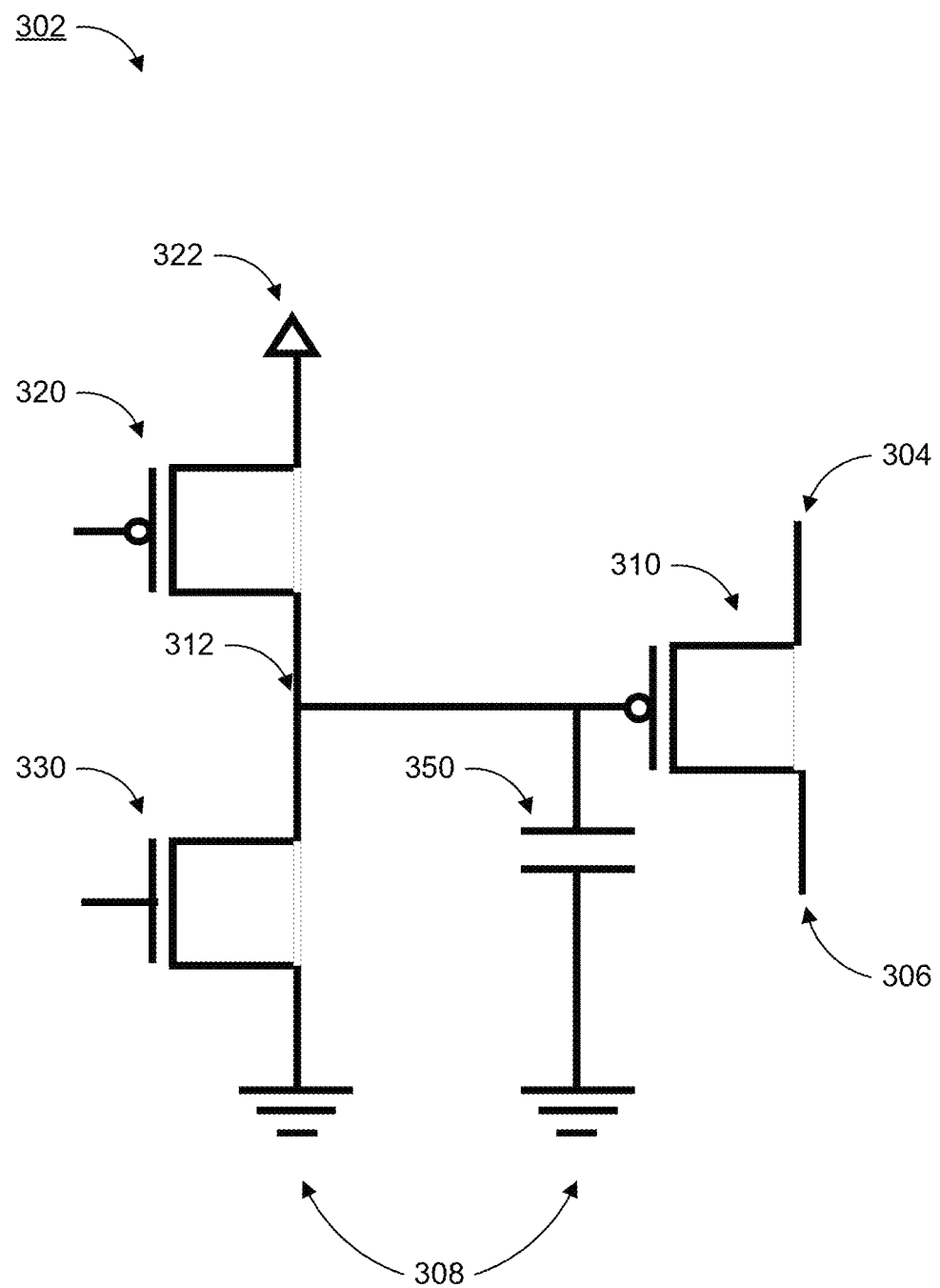
FIG. 4 is a diagram showing a capacitive analog memory circuit, in accordance with an embodiment of the present invention.

Referring now to FIG. 4, a diagram of a capacitive analog memory circuit is depicted according to an embodiment of the present invention.

According to an embodiment of the present invention, an analog memory cell 302 can include a storage component such as a capacitor 350 for storing kernel weights. As described above with reference to FIG. 3, the capacitor 350 can be used to modify by, e.g., multiplication, a signal corresponding to a pixel value from a word line 304 and output a value via bit line 306 according to a state of a readout transistor 310.

The capacitor 350 is driven by a charge voltage 322 through a charge transistor 320, and to ground 308 via a discharge transistor 330. The charge transistor 320 can include, e.g., a field effect transistor (FET) such as, e.g., a p-type FET (pFET). The discharge transistor 330 can include, e.g., a FET such as, e.g., a n-type FET (nFET). A drain of each of the charge transistor 320 and the discharge transistor 330 are coupled to node 312. A source of the charge transistor 320 is coupled to the charge voltage 322 while a source of the discharge transistor 330 is coupled to the ground 308.

The capacitor 350 is therefore electrically connected to node 312 to receive a charging current from the charge transistor 320. As a result, a voltage at node 312 gradually increases due to the charging activity of the charging current. The capacitor 350 is discharged through the discharge transistor 330, causing the voltage at node 312 to decrease. The capacitor 350 voltage is thus adjusted by charging and discharging. As the voltage of the capacitor 350 changes, the conductance of the readout transistor 310 changes continuously.

Figure 5:
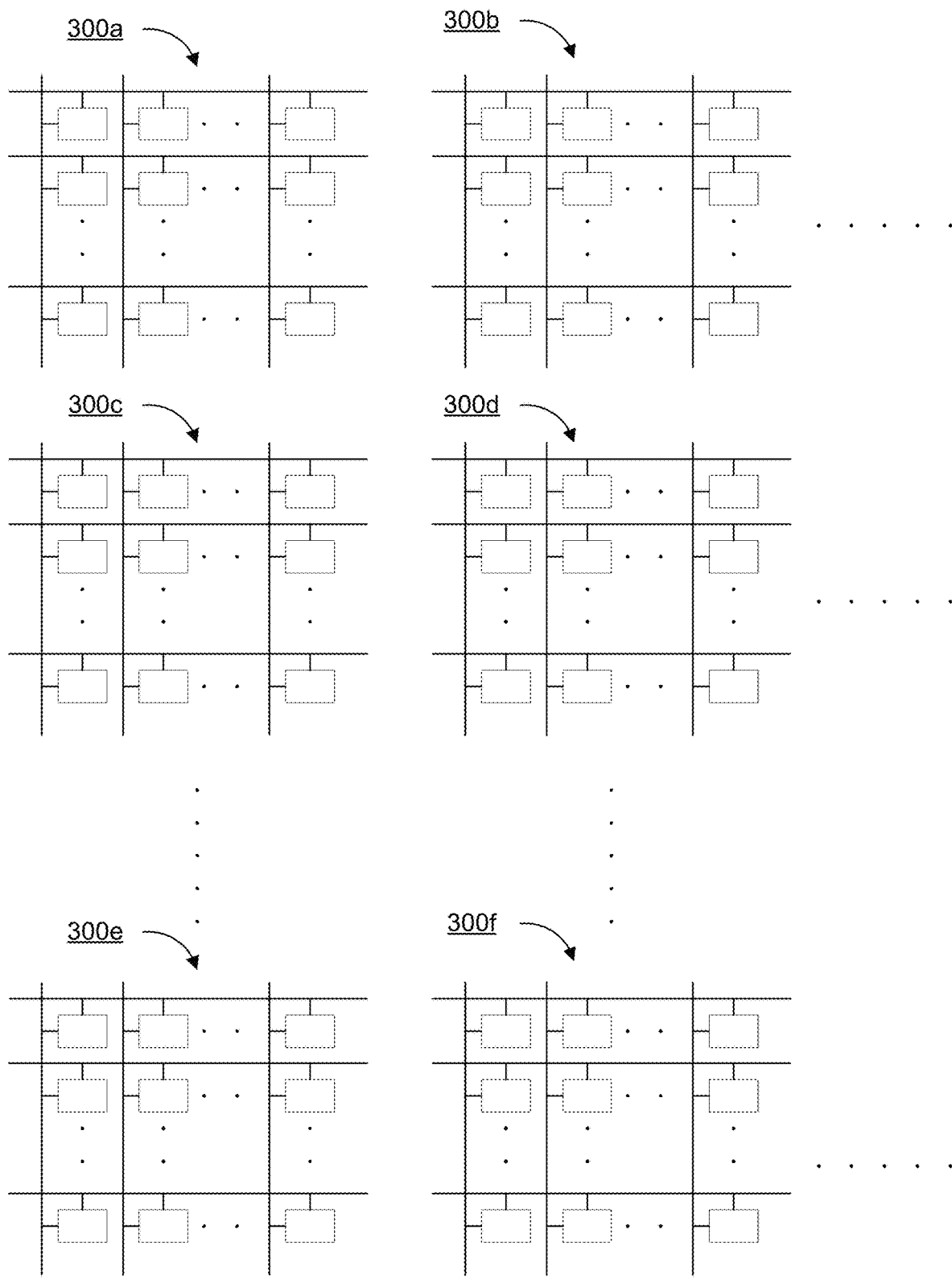
FIG. 5 is a diagram showing a set of networks of capacitive analog memory circuits for performing matrix operations with corresponding sets of kernels, in accordance with an embodiment of the present invention.

Referring now to FIG. 5, a diagram of a set of networks of capacitive analog memory circuits for performing matrix operations with corresponding sets of kernels is depicted according to an embodiment of the present invention.

According to aspects of the present invention, hardware acceleration using an array of analog memory cells as described above can be implemented using multiple cross-bar arrays 300a-f. Each cross-bar array 300a-f can implement a separate set of kernels from the kernel matrix. Accordingly, a set of image patches can be assigned to corresponding cross-bar arrays 300a-f to perform multiplication on pixel values with corresponding kernel weights in parallel. Accordingly, word lines and bit lines for each of the cross-bar arrays 300a-f are independent. Thus, independent signals can be processed by each cross-bar array 300a-f concurrently and independently.

As a result, an image having N number of patches resulting from a selected kernel size and stride can be processed in fewer than N forward passes through a cross-bar array. Instead, the number of forward passes can be reduced by orders of magnitude because the forward passes are divided across P number of cross-bar arrays 300a-f. Accordingly, forward pass time is also reduced by orders of magnitude. For example, P can be any number in the range of between about 10 and about 1000 cross-bar arrays 300a-f or more. As a result, an image that takes $N^2 * t_i$ seconds for a complete forward pass through a single cross-bar array, will take $$\frac{N^2}{P} * t_i \text{ seconds},$$

where $t_i$ is integration time in seconds.

During training, the capacitor charge is constantly modified to reduce the error associated with inferencing a set of input data or images. The process is as follow. First the image data is forward passed through all the network layers and the result is compared with the desired output which normally includes image classifications. The error between the results and the desired output is then backward propagated through the network layers and the weight is updated based of the errors. As the learning process continues, the multiple copies of the set of kernel weights can diverge from each other since they will learn separately. So there is a desire to average the weight of the multiple copies of the set of kernels periodically.

Figure 6:
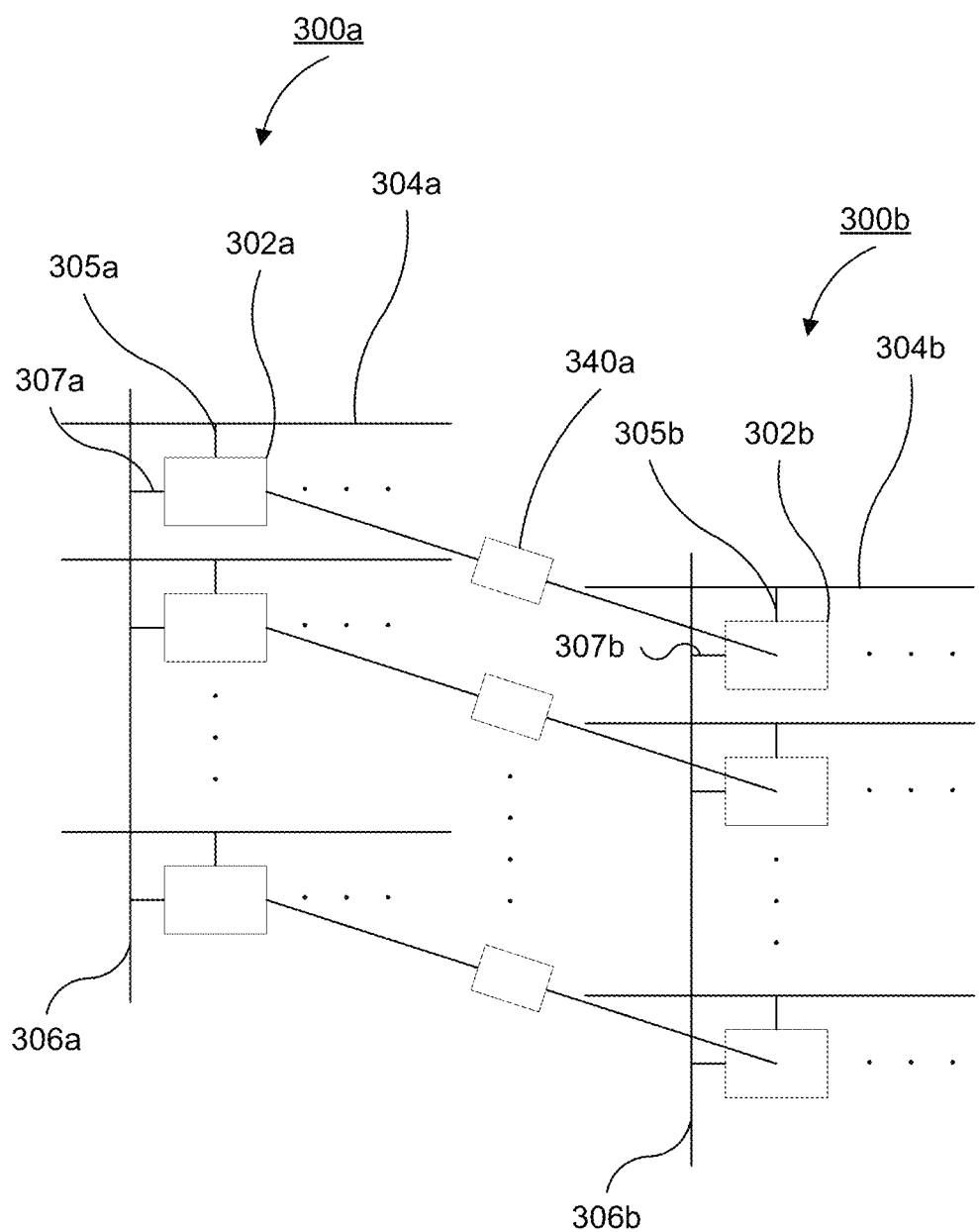
FIG. 6 is a diagram showing a network of capacitive analog memory circuits for performing matrix operations with a set of kernels connected to a second network of capacitive analog memory circuits by pass gates, in accordance with an embodiment of the present invention.

Referring now to FIG. 6, a diagram of a network of capacitive analog memory circuits for performing matrix operations with a set of kernels connected to a second network of capacitive analog memory circuits by pass gates is depicted according to an embodiment of the present invention.

According to aspects of the present invention, matrix operations with a kernel can be accelerated by using multiple sets of cross-bar arrays 300a and 300b, for example, using multiple sets of cross-bar arrays corresponding to multiple copies of the sets of kernels as described above. However, each cross-bar array 300a and 300b can include related kernels, such as, e.g., analog memory cells 302a and 302b that are related. For example, the analog memory cell 302a can represent a same kernel entry as the analog memory cell 302b such that the analog memory cells 302a and 302b are duplicates for operating on different image patches in parallel, and thus concurrently.

A first image patch, therefore, can be provided to the first analog memory cells 302a of the first cross-bar array 300a via the first word line 304a and first word line connections 305a. The first analog memory cells 302a can process the pixel values of the first image patch using a stored analog value stored in, e.g., a capacitor or resistor. Each processed pixel value of the first image patch is output to the first bit line 306a via first bit line connections 307a and summed.

Similarly, a second image patch, therefore, can be provided to the first analog memory cells 302b of the second cross-bar array 300b via second first word line 304b and second word line connections 305b. The second analog memory cells 302b can process the pixel values of the second image patch using a stored analog value stored in, e.g., a capacitor or resistor. Each processed pixel value of the second image patch is output to the second bit line 306b via second bit line connections 307b and summed.

A backward and update pass can be used to update the first and second analog memory cells 302a and 302b by providing each of the first and second analog memory cells 302a and 302b with an update signal via the first and second bit lines 306a and 306b, respectively. While the first analog memory cell 302a and the second analog memory cell 302b are related entries of a kernel accelerated by the cross-bar arrays 300a and 300b, after many operations and many forward, backward and update passes, the values stored in each of the first analog memory cell 302a and the second analog memory cell 302b can diverge. Thus, error can be introduced into the network by applying inconsistent kernels to the image patches.

Accordingly, aspects of the present invention include uniformly distributing the kernel weights between the first analog memory cell 302a and the second analog memory cell 302b by, e.g., sharing a capacitor charge between the first analog memory cell 302a and the second analog memory cell 302b. Sharing the charge of the capacitors of each of the first analog memory cell 302a and the second analog memory cell 302b can prevent diverging kernel values, and thus facilitate more consistent and accurate kernel application and kernel updates via a backward pass.

Therefore, the capacitor of the first analog memory cell 302a can share a charge with the capacitor of the second analog memory cell 302b using a capacitor line 340a. The capacitor line 340a can be, e.g., a pass-gate using two FETs for bidirectional charge transfer, or other component for connecting the capacitor of the first analog memory cell 302a with the capacitor of the second analog memory cell 302b including, e.g., a wire. Thus, the first analog memory cell 302a can provide charge to the second analog memory cell 302b, and the second analog memory cell 302b can provide charge to the first analog memory cell 302a depending on the charges in the capacitors of each of the first and second analog memory cells 302a and 302b. As a result, capacitor charge is distributed between the capacitors of the related analog memory cells 302a and 302b. As such, the values stored therein are effectively normalized, or averaged, to improve consistency.

Moreover, by employing multiple sets of cross-bar arrays 300a and 300b and normalizing related kernel values stored in analog memory cells 302a and 302b, accuracy of kernel weights and kernel weight updates via update passes can be improved. Kernel values can be updated across many cross-bar arrays 300a and 300b, thus increasing a distribution of kernel updates. Normalizing the kernel values of related analog memory cells 302a and 302b leverages the distribution to converge on a more accurate kernel value for each entry of the kernel.

Figure 7:
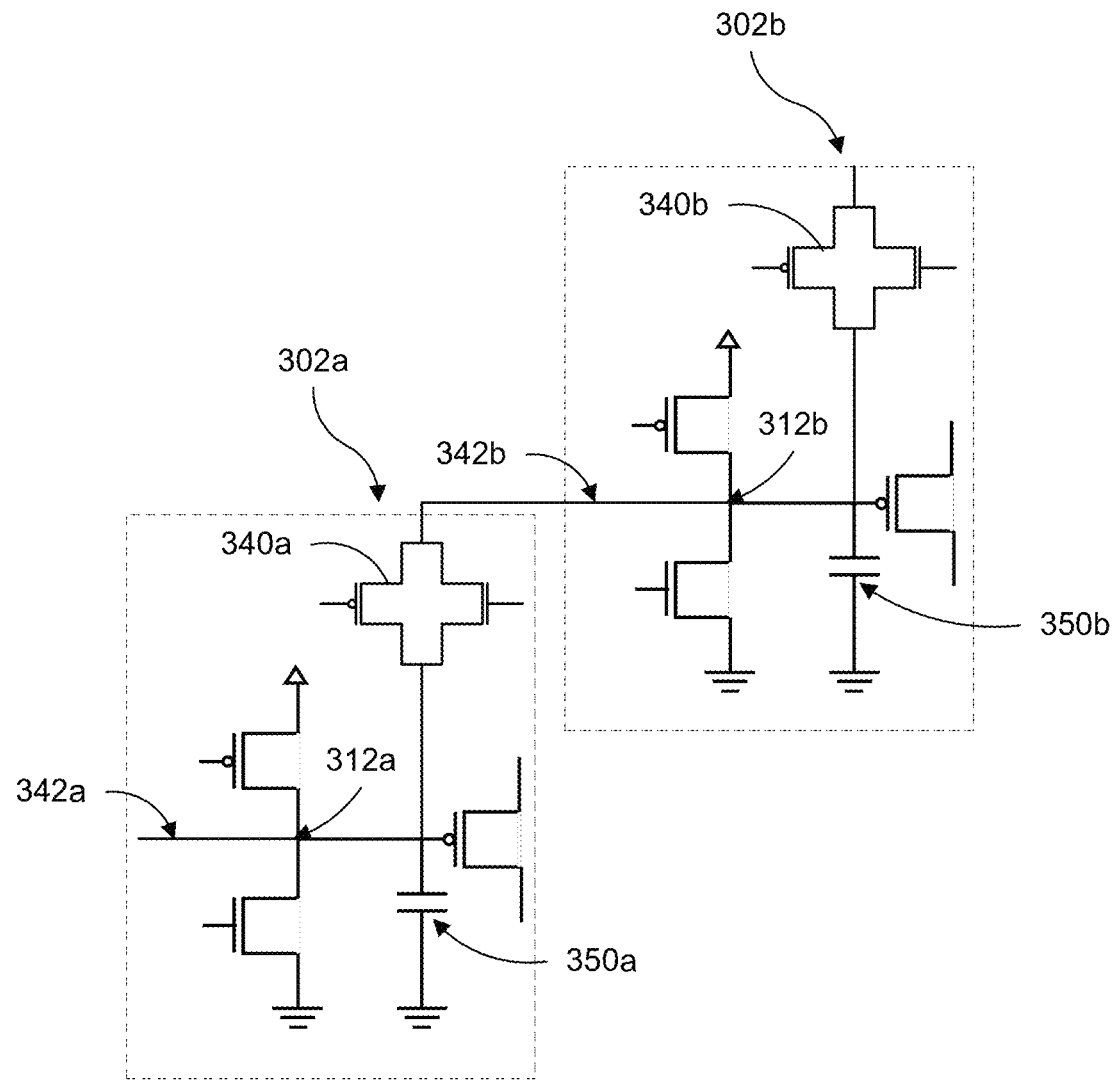
FIG. 7 is a diagram showing a capacitive analog memory circuit with a capacitor connected to a capacitor of a second capacitive analog memory circuit by a pass gate, in accordance with an embodiment of the present invention.

Referring now to FIG. 7, a diagram of a capacitive analog memory circuit with a capacitor connected to a capacitor of a second capacitive analog memory circuit by a pass gate is depicted according to an embodiment of the present invention.

According to an embodiment of the present invention, a first analog memory cell 302a can be connected to a related second analog memory cell 302b by using a first pass-gate 340a. A first kernel weight is stored by a charge in a first capacitor 350a of the first analog memory cell 302a. A second kernel weight is stored by a charge in a second capacitor 350b of the second analog memory cell 302b. However, both the first kernel weight and the second kernel weight can correspond to a common entry of a kernel applied to an image. Thus, the first kernel weight is related to the second kernel weight. Therefore, to prevent diverging values due to differing charges, the first capacitor 350a is connected with the second capacitor 350b via a second charge sharing line 342b and second node 312b.

The first pass-gate 340a can be located or positioned between the second charge sharing line 342b and the first capacitor 350a. The first pass-gate 340a includes two transistors, such as, e.g., FETs including, e.g., an nFET and a pFET, or any other suitable transistor configuration. As such, the first pass-gate 340a can controllably share a charge between the first capacitor 350a and the second capacitor 350b by controlling the transistors of the first pass-gate 340a to direct current flow towards or away from the first capacitor 350a. As a result, charge in each of the first capacitor 350a and the second capacitor 350b can be distributed to normalize kernel weights stored via each of the first and second capacitors 350a and 350b.

While only two analog memory cells 302a and 302b are depicted, additional analog memory cells can be included. For example, a third analog memory cell can have a third capacitor connected to the second capacitor 350b via the second pass-gate 340b of the second analog memory cell 302b. Similarly, a fourth analog memory cell can have a fourth capacitor connected to the first capacitor 350a through first charge sharing line 342a and first node 312a using a fourth pass-gate of the fourth analog memory cell. As a result, any suitable number of capacitors can be connected to share charge and thus normalize kernel weights across a corresponding number of kernel sets.

Figure 8:
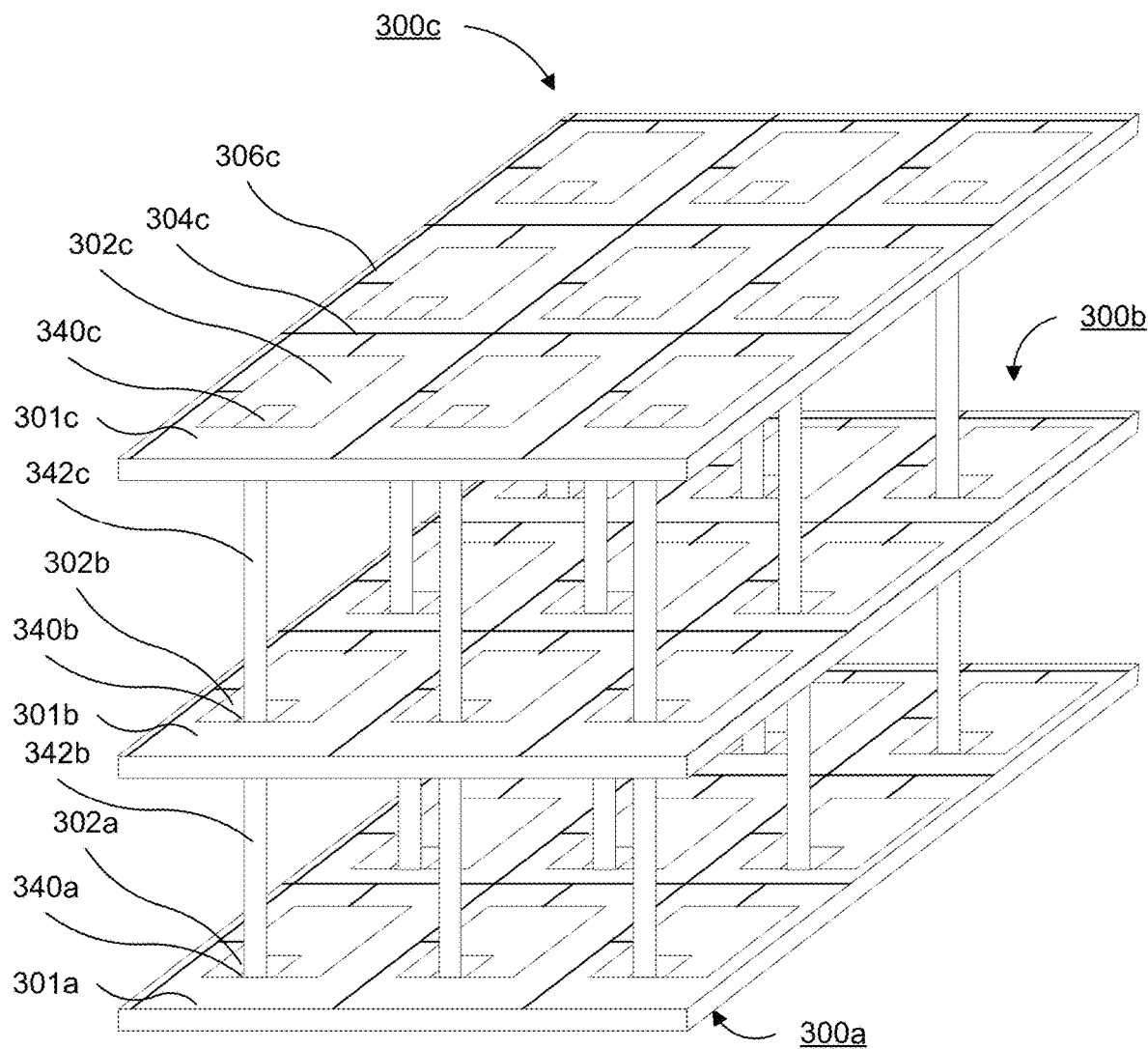
FIG. 8 is a perspective view showing a device having multiple sets of capacitive analog memory cells connected via pass gates, in accordance with an embodiment of the present invention.

Referring now to FIG. 8, a perspective view of a device having multiple sets of capacitive analog memory cells connected via pass gates is depicted according to an embodiment of the present invention.

According to aspects of the present embodiment a system for hardware acceleration of matrix operations such as, e.g., matrix multiplication and convolution, includes a device having multiple analog memory sets 300a, 300b and 300c. Each analog memory set 300a-c can include substrates 301a-301c, analog memory cells 302a-c, word lines 306a-c, bit lines 304a-c and charge sharing lines 342a-c.

A first analog memory set 300a can include a first substrate 301a. The first substrate 301a can include, e.g., a semiconductor substrate such as any suitable substrate structure, e.g., a bulk semiconductor, a semiconductor-on-insulator (SOI) substrate, etc. In one example, the first substrate 301a can include a silicon-containing material. Illustrative examples of Si-containing materials suitable for the first substrate 301a can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Formed on the first substrate 301a are the first analog memory cells 302a, as well as metallizations for electrical connection of the first analog memory cells 302a, including, e.g., first bit lines 304a and first word lines 306a. The first analog memory cells 302a and the metallizations can be formed via, e.g., a series of deposition, lithography and etching processes to form the analog memory cell circuits as described above with reference to FIGS. 4 and 7. As such, gate structures can be built up on the first substrate 301a to form the FETs and capacitors of the analog memory cell circuits. The FETs can include, e.g., fin-type FETs (finFETs), planar FETs, vertical FETs (VFETs), or any other suitable metal oxide semiconductor FETs (MOSFETs) or complementary metal oxide semiconductor (CMOS) FETs.

For example, the FETs can be formed by utilizing conventional processing steps that are capable of fabricating MOS transistor devices. Included in the conventional transistor processing steps are: N-well for pFET photolithography, N-well implant, pFET thin oxide tailor implant, P-well for nFET photolithography, P-well implant, n-FET thin oxide tailor implant, dual gate oxide photolithography, dual gate oxide regrowth, FET gate photolithography, FET gate etch, thermal oxide spacer formation, nFET extension photolithography, nFET extension implant (lightly doped drains (LDD)), first spacer formation, pFET extension photolithography, pFET extension (LDD), second spacer deposition, second spacer etch, nFET S/D implant photolithography, nFET S/D anneals. As such, suitable CMOS processes can be used for forming the analog memory cell circuits of the first analog memory cells 302a.

The first word lines 306a and the first bit lines 304a can be formed with similar processes to deposit conductive lines. The first word lines 306a and the first bit lines 304a can include any conductive material including but not limited to: polysilicon; a conductive elemental metal such as W, Cu, Pt, Ag, Au, Ru, Jr, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials.

While not shown, to insulate and protect the first analog memory cells 302a of the first analog memory set 300a, a layer of dielectric material is blanket deposited atop the entire first substrate 301a and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to forth via holes to the various source/drain and gate conductor regions of the first substrate 301a, such as, e.g., to the first pass-gate 340a of the first analog memory cells 302a. Following via formation, interconnects including charge sharing lines are formed by depositing a conductive metal into the via holes using conventional processing, such as CVD or plating. The conductive metal may include, but is not limited to: tungsten, copper, aluminum, silver, gold, and alloys thereof.

The conductive metal in the via holes of the dielectric can include the second charge sharing line 342b. The second charge sharing line 342b extends through the dielectric layer above the first analog memory cells 302a to connect to the first pass-gate 340a of each of the first analog memory cells 302a. Thus, a second analog memory set 300b can be formed on the first analog memory set 300a in a vertically stacked arrangement with related second analog memory cells 302b and first analog memory cells 302a aligned in a plane perpendicular to a plane including the first word lines 306a and first bit lines 304a.

To form a connection with the second charge sharing lines 342b, via holes can be formed through the second substrate 301b to the second analog cells 302b. As a result, the second charge sharing lines 342b extend through the dielectric layer between the first analog memory set 300a and the second analog memory set 300b to connect capacitors of the first analog memory cells 302a with related second analog memory cells 302b.

A third analog memory set 300c can be formed in a similar manner to the second analog memory set 300b. Thus, third analog memory cells 302c are connected to the related first and second analog memory cells 302a and 302b. As many analog memory sets as desired can be stacked to provide parallel hardware acceleration of image processing with a kernel. As such, each patch of the image can be assigned to one of the analog memory sets 300a-c and processed by the analog memory cells 302a-c as described above. Because the sets 300a-c are stacked vertically, dividing up a kernel matrix into multiple sets to be accelerated with multiple analog memory sets 300a-c can also reduce a footprint of the device, thus increasing space efficiency.

Figure 9:
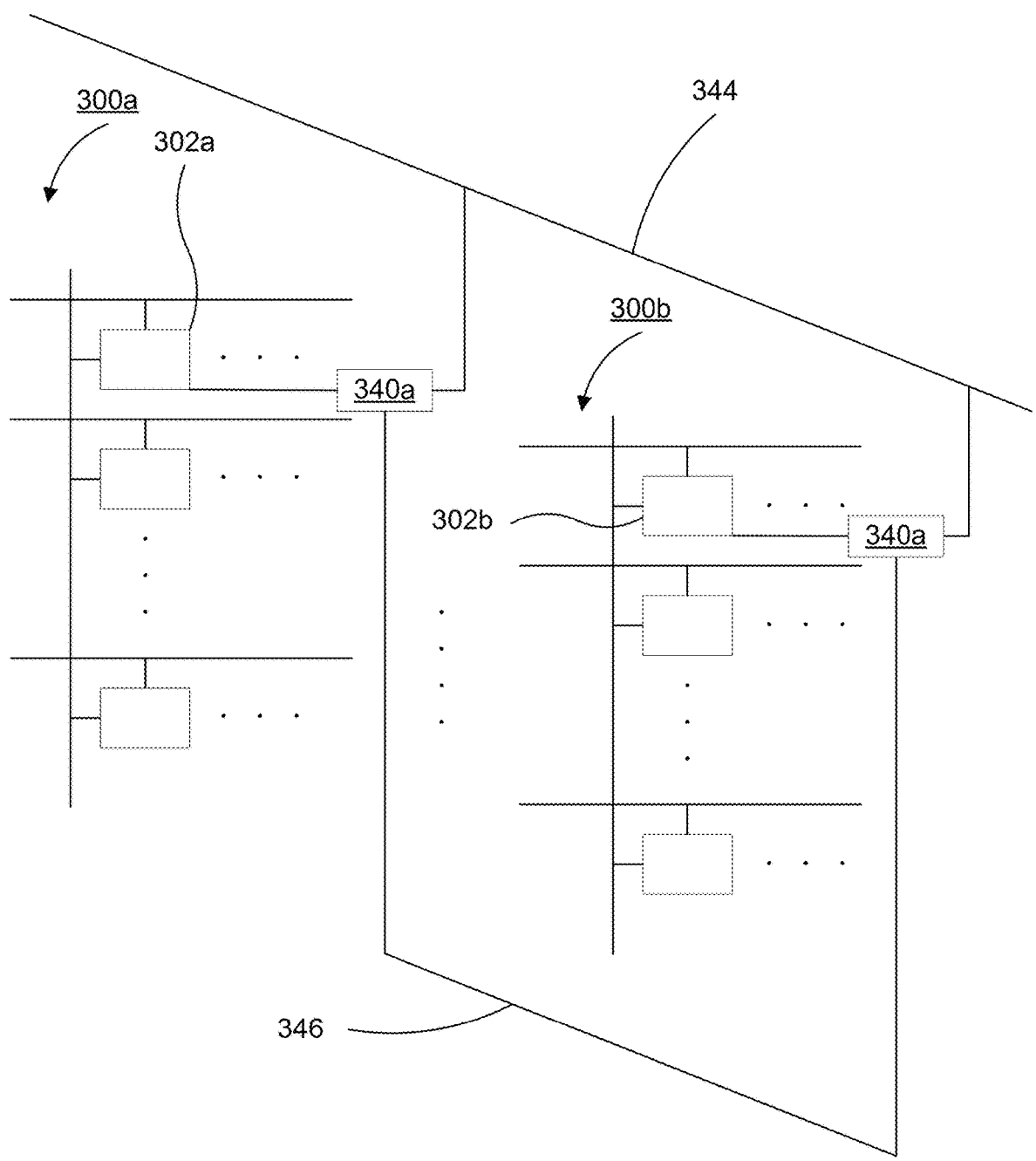
FIG. 9 is a diagram showing a network of capacitive analog memory circuits for performing matrix operations with a set of kernels connected to a second network of capacitive analog memory circuits using pass gates connected via share lines, in accordance with an embodiment of the present invention.

Referring now to FIG. 9, a diagram of a network of capacitive analog memory circuits for performing matrix operations with a set of kernels connected to a second network of capacitive analog memory circuits using pass gates connected via share lines is depicted according to an embodiment of the present invention.

According to an embodiment of the present invention, analog memory cells 302a and 302b can be connected across multiple sets 300a-b of analog memory cells 302a-b to connect weights from multiple copies of sets of kernels. Each weight is connected to share line 344 using a pass gate 340a, 340b, which is controlled by a share signal 346. Each column of the weight is then shared by enabling the share signal 346 for that column. This is repeated throughout all columns. Multiple share lines 344 are also possible in which case multiple columns can share a same share line 344. For example, for five share lines 344 per row, then each group of five weight columns can be activated to share weights concurrently, as each will have an independent share line 344.

Figure 10:
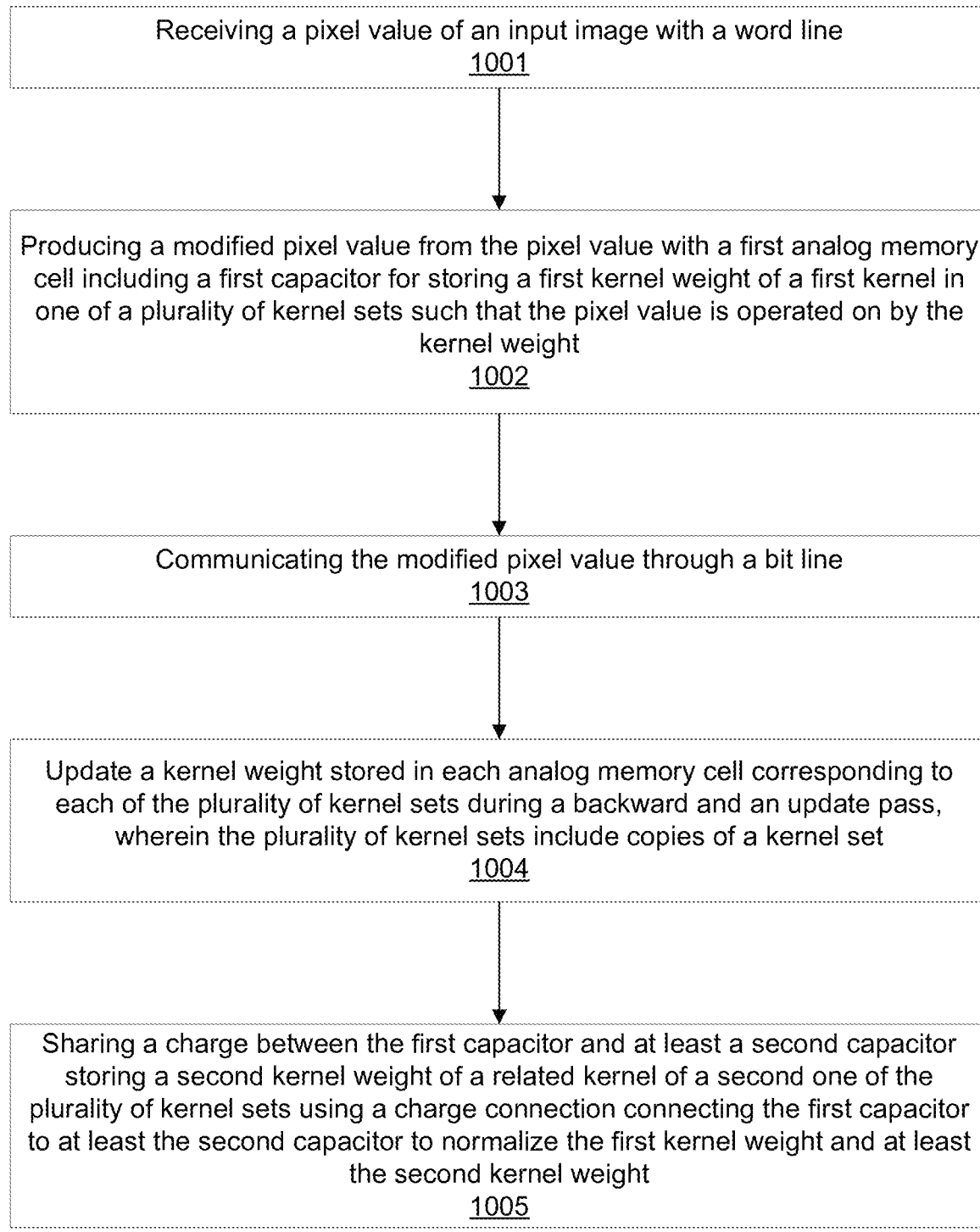
FIG. 10 is a block/flow diagram showing system/method kernel sets normalization with capacitor charge sharing, in accordance with an embodiment of the present invention.

Referring now to FIG. 10, a block/flow diagram of a system/method kernel sets normalization with capacitor charge sharing is depicted according to an embodiment of the present invention.

At block 1001, a pixel value of an input image is received with a word line.

At block 1002, a modified pixel value is produced from the pixel value with a first analog memory cell including a first capacitor for storing a first kernel weight of a first kernel in one of a plurality of kernel sets such that the pixel value is operated on by the kernel weight.

At block 1003, the modified pixel value is communicated through a bit line.

At block 1004, a kernel weight stored in each analog memory cell is updated corresponding to each of the plurality of kernel sets during a backward and an update pass, wherein the plurality of kernel sets include copies of a kernel set.

At block 1005, a charge is shared between the first capacitor and at least a second capacitor storing a second kernel weight of a related kernel of a second one of the plurality of kernel sets using a charge connection connecting the first capacitor to at least the second capacitor to normalize the first kernel weight and at least the second kernel weight.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device for multiple copies of a set of multi-kernel set operations in a hardware accelerated neural network, the device including:
   a word line for receiving a pixel value of an input image;
   a bit line for communicating a modified pixel value;
   an analog memory cell including a first capacitor for storing a first kernel weight of a first kernel in one of a plurality of kernel sets such that the pixel value is operated on by the first kernel weight to produce the modified pixel value;
   a charge connection connecting the first capacitor to at least a second capacitor storing a second kernel weight of a related kernel of a second one of the plurality of kernel sets such that charge is shared between the first capacitor and at least the second capacitor to normalize the first kernel weight and the second kernel weight; and
   a first cross-bar array having a first set of analog memory cells, including a first analog memory cell, for performing convolutions on a first patch of the input image; and
   a second cross-bar array having a second set of analog memory cells, including a second analog memory cell corresponding to the second capacitor, for performing convolutions on a second patch of the input image concurrently with the convolutions on the first patch of the input image.

2. The device as recited in claim 1, wherein the charge connection includes a pass-gate.

3. The device as recited in claim 1, wherein the charge connection connects the first capacitor directly to at least the second capacitor.

4. The device as recited in claim 1, further including a charge field effect transistor (FET) connecting the first capacitor to a charge voltage.

5. The device as recited in claim 1, further including a discharge FET connecting the first capacitor to a ground.

6. The device as recited in claim 1, further including a readout FET connecting the word line and the bit line to the first capacitor for a continuous modulation of a signal through the readout FET.

7. The device as recited in claim 1, wherein the second capacitor is connected to a second word line and a second bit line in the second cross-bar array.

8. The device as recited in claim 7, wherein:
   the charge of the first capacitor is updated by a first update signal received by the bit line of the first analog memory cell;
   the charge of the second capacitor is updated by a first update signal received by the second bit line; and
   the charge of the first capacitor and the charge of the second capacitor are normalized by the charge connection to average kernel weights corresponding to each of the charge of the first capacitor and the charge of the second capacitor.

9. A device for multiple copies of a set of multi-kernel set operations in a hardware accelerated neural network, the device including:
   a first cross-bar array for accelerating convolutions of at least one first patch of an input image, the first cross-bar array including:
      a plurality of first word lines for receiving pixel values of the input image;
      a plurality of first bit lines for communicating modified pixel values; and
      a plurality of first analog memory cells, each analog memory cell including a first capacitor for storing a corresponding kernel weight of a first kernel in one of a plurality of kernel sets such that each pixel value is operated on by the first kernel weight to produce the modified pixel value;

at least a second cross-bar array separate from the first cross-bar array for accelerating convolutions of at least one second patch of the input image concurrently with the convolutions on the first patch of the input image; and a plurality of charge connections connecting respective first capacitors to at least a respective second capacitor of at least the second cross-bar array, the respective second capacitor storing a second kernel weight of a related kernel of a second one of the plurality of kernel sets such that charge is shared between a respective first capacitor and at least the respective second capacitor to normalize the first kernel weight and the second kernel weight.

10. The device as recited in claim 9, wherein the charge connection includes a pass-gate.

11. The device as recited in claim 9, wherein the charge connection connects the first capacitor directly to at least the second capacitor.

12. The device as recited in claim 9, further including a charge field effect transistor (FET) connecting the first capacitor to a charge voltage.

13. The device as recited in claim 9, further including a discharge FET connecting the first capacitor to a ground.

14. The device as recited in claim 9, further including a readout FET connecting a word line and a bit line of the plurality of word lines and bit lines, respectively, to the first capacitor for a continuous modulation of a signal through the readout FET.

15. The device as recited in claim 9, wherein each of the first cross-bar array and at least the second cross-bar array includes a plurality analog memory cells to accelerate convolutions of the at least one first patch and the at least one second patch, respectively, by providing values corresponding to each pixel to corresponding ones of the plurality of analog memory cells through a corresponding plurality of first word lines.

16. The device as recited in claim 15, wherein:
the charge of the first capacitor is updated by a first update signal received by the bit line of the first analog memory cell;
the charge of the second capacitor is updated by a first update signal received by a second bit line in the second cross-bar array; and
the charge of the first capacitor and the charge of the second capacitor are normalized by the charge connection to average kernel weights corresponding to each of the charge of the first capacitor and the charge of the second capacitor.

17. A method for multi-kernel set operations in a hardware accelerated neural network, the method including:
receiving a pixel value of an input image with a word line;
producing a modified pixel value from the pixel value with a first analog memory cell including a first capacitor for storing a first kernel weight of a first kernel in one of a plurality of kernel sets such that the pixel value is operated on by the kernel weight;
communicating the modified pixel value through a bit line;
sharing a charge between the first capacitor and at least a second capacitor storing a second kernel weight of a related kernel of a second one of the plurality of kernel sets using a charge connection connecting the first capacitor to at least the second capacitor to normalize the first kernel weight and at least the second kernel weight;
performing convolutions on a first patch of the input image by a first set of analog memory cells of a first cross-bar array including the first analog memory cell; and
performing convolutions on a second patch of the input image concurrently with the convolutions on the first patch of the input image, by a second set of analog memory cells of a second cross-bar array including the second capacitor in a second analog memory cell.

18. The method as recited in claim 17, further including modulating the sharing of the charge between the first capacitor and at least the second capacitor with the charge connection by using a pass-gate.

* * * * *